United States Patent
Adusumilli et al.

(10) Patent No.: US 10,002,789 B2
(45) Date of Patent: Jun. 19, 2018

(54) HIGH PERFORMANCE MIDDLE OF LINE INTERCONNECTS

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 15/079,368

(22) Filed: Mar. 24, 2016

(65) Prior Publication Data

US 2017/0278747 A1  Sep. 28, 2017

(51) Int. Cl.
*H01L 21/768* (2006.01)
*H01L 23/522* (2006.01)

(52) U.S. Cl.
CPC .... *H01L 21/76844* (2013.01); *H01L 23/5226* (2013.01)

(58) Field of Classification Search
CPC ............... H01L 21/76844; H01L 23/5226
USPC ........................................................ 257/383
See application file for complete search history.

(56) References Cited

U.S. PATENT DOCUMENTS

| | | | |
|---|---|---|---|
| 5,933,753 A | 8/1999 | Simon et al. | |
| 6,391,785 B1 | 5/2002 | Satta et al. | |
| 6,607,977 B1 | 8/2003 | Rozbicki et al. | |
| 6,624,066 B2 | 9/2003 | Lu et al. | |
| 6,939,801 B2 | 9/2005 | Chung et al. | |
| 6,943,111 B2 | 9/2005 | Lin et al. | |
| 7,407,875 B2 | 8/2008 | Wong et al. | |
| 7,694,413 B2 | 4/2010 | Johnston et al. | |
| 8,252,680 B2 | 8/2012 | Lavoie | |
| 8,361,900 B2 | 1/2013 | Pan et al. | |
| 8,614,107 B2 | 12/2013 | Lavoie et al. | |
| 2003/0068894 A1 | 4/2003 | Iggulden et al. | |
| 2004/0127014 A1 | 7/2004 | Huang et al. | |
| 2007/0218659 A1* | 9/2007 | Spencer .......... | H01L 21/823807 438/497 |
| 2009/0166867 A1 | 7/2009 | Simka et al. | |
| 2011/0233778 A1 | 9/2011 | Lee et al. | |
| 2014/0077379 A1 | 3/2014 | Dirk et al. | |
| 2015/0014778 A1* | 1/2015 | Cheng ............. | H01L 23/5226 257/369 |

OTHER PUBLICATIONS

Wu et al., "Advanced Metal Barrier Free Cu Damascene Interconnects with PECVD Silicon Carbide Bafflers for 90/65-nm BEOL Technology", Proc. IEEE IEDM, 2002, pp. 595-598.

(Continued)

*Primary Examiner* — Fernando L Toledo
*Assistant Examiner* — Adam S Bowen
(74) *Attorney, Agent, or Firm* — Scully, Scott, Murphy & Presser, P.C.; Daniel P. Morris, Esq.

(57) ABSTRACT

A method for formation of multi-level contact structures with reduced contact resistance is provided. The contact resistance of the multi-level contact structures can be reduced by selectively removing portions of a contact liner layer that are formed along sidewalls and bottom portions of contact openings located in each contact level from the bottom portions of the contact openings.

11 Claims, 11 Drawing Sheets

(56) References Cited

OTHER PUBLICATIONS

Siew et al., "CVD Mn-based Self-Formed Barrier for Advanced Interconnect Technology" Proc. IEEE IITC, 2013, pp. 1-3.
Li et al., "Barrier-free direct-contact-via (DCV) structures for copper interconnects", Electronics Letters, 2002, vol. 38, No. 18, pp. 1026-1028.
Usui et al., "Highly Reliable Copper Dual-Damascene Interconnects With Self-Formed MnSixOy Barrier Layer", IEEE Trans. Electron Devices, 2006, vol. 53, No. 10, pp. 2492-2499.
Corresponds to U.S. Appl. No. 14/755,440, filed Jun. 30, 2015.

* cited by examiner

HIGH PERFORMANCE MIDDLE OF LINE INTERCONNECTS

BACKGROUND

The present application relates to contact structures for semiconductor devices, and more particularly, to multi-level contact structures with reduced contact resistance.

Multiple middle-of-line (MOL) contact levels have been employed at the 7 nm node to provide wiring flexibility for system-on-chip (SOC) applications. Typically, due to the large number of circuit elements and the required complex layout of modern integrated circuits, the electrical connections of the individual circuit elements cannot be established within the same device level on which the circuit elements are manufactured, but require one or more additional metallization layers. Furthermore, in order to actually connect the circuit elements formed in the semiconductor material with the metallization layers, an appropriate vertical contact structure is needed, a first lower end of which is connected to a respective contact region of a circuit element, such as a gate electrode and/or the drain and source regions of transistors, and a second end is connected to a respective interconnect structure in the metallization layer. A interconnect/contact structure at a single contact level typically includes a contact conductor portion and a contact liner/barrier present along the sidewalls and bottom surface of the contact conductor portion to prevent the diffusion of metal ions into surrounding dielectric materials. However, the presence of the contact liner/barrier at the interfaces between these multiple contact levels can lead to an increase in contact resistance and an overall increase in parasitic resistance. A method that allows reducing contact resistance in multi-level contact structures remains needed.

SUMMARY

The present application provides a method for formation of multi-level contact structures with reduced contact resistance. The contact resistance of the multi-level contact structures can be reduced by selectively removing portions of a contact liner layer that are formed along sidewalls and bottom portions of contact openings located in each contact level from the bottom portions of the contact openings.

In one aspect of the present application, a semiconductor structure is provided. The semiconductor structure includes a gate structure located over a channel region of a semiconductor fin and laterally surrounded by an interlevel dielectric (ILD) layer, source/drain regions located on opposite sides of the gate structure, a trench contact structure embedded within the ILD layer and contacting each of the source/drain regions, a multi-level source/drain contact structure overlying the trench contact structure and a multi-level gate contact structure overlying the gate structure. The multi-level source/drain contact structure includes a stack of a CA contact structure and a first interconnect contact structure overlying the CA contact structure. The CA contact structure includes a CA contact conductor portion in direct contact with a trench contact conductor portion in the trench contact structure and CA contact liner portions laterally surrounding the CA contact conductor portion. The first interconnect contact structure includes a first interconnect conductor portion in direct contact with the CA contact conductor portion and first interconnect liner portions laterally surrounding the first interconnect conductor portion. The multi-level gate contact structure includes a stack of a CB contact structure and a second interconnect contact structure overlying the CB contact structure. The CB contact structure includes a CB contact conductor portion in direct contact with a gate electrode in the gate structure and CB contact liner portions laterally surrounding the CB contact conductor portion. The second interconnect contact structure includes a second interconnect conductor portion in direct contacting the CB contact conductor portion and second interconnect liner portions laterally surrounding the second interconnect conductor portion.

In another aspect of the present application, a method of forming a semiconductor structure is provided. The method includes forming source/drain regions on opposite sides of a gate structure located over a channel region of a semiconductor fin. The gate structure includes from bottom to top, a gate dielectric, a gate electrode and a gate cap. Trench contact structures are then formed embedded in an interlevel dielectric (ILD) layer that laterally surrounds the gate structure. Each of the trench contact structures vertically contacts one of the source/drain regions. Next, a first contact level dielectric layer is formed over the gate structure, the trench contact structures and the ILD layer. After forming a CA contact opening extending through the first contact level dielectric layer to expose at least a portion of each of the trench contact structures and a CB contact opening extending through the first contact level dielectric layer and the gate cap to expose at least a portion of the gate electrode, a CA contact structure is formed within the CA contact opening and a CB contact structure is formed within the CB contact opening. The CA contact structure includes CA contact liner portions present on sidewalls of each CA contact opening and a CA contact conductor portion filling a remaining volume of the CA contact opening. The CB contact structure includes CB contact liner portions present on sidewalls of the CB contact opening and a CB contact conductor portion filling a remaining volume of the CB contact opening. Next, a second contact level dielectric layer is formed over the CA contact structure, the CB contact structure and the first contact level dielectric layer. After forming a first interconnect opening extending through the second contact level dielectric layer to expose at least a portion of the CA contact conductor portion and a second interconnect opening extending through the second contact level dielectric layer to expose at least a portion of the CB contact conductor portion, a first interconnect structure is formed within the first interconnect opening and a second interconnect structure is formed within the second interconnect opening. The first interconnect structure includes first interconnect liner portions present on sidewalls of the first interconnect opening and a first interconnect conductor portion filling a remaining volume of the first interconnect opening. The second interconnect structure includes second interconnect liner portions present on sidewalls of the second interconnect opening and a second interconnect conductor portion filling a remaining volume of the second interconnect opening.

DETAILED DESCRIPTION

Figure 1:
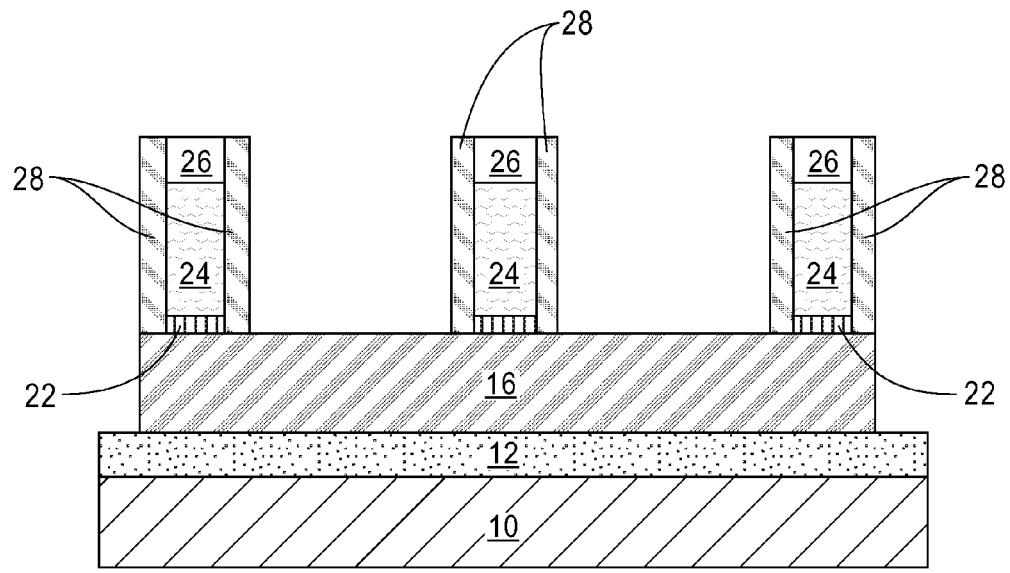
FIG. 1 is a cross-sectional view of an exemplary semiconductor structure including gate structures formed over a semiconductor fin which is located on a substrate according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, an exemplary semiconductor structure according to an embodiment of the present application includes gate structures formed over a semiconductor fin 16 located on a substrate. Although a single semiconductor fin 16 is shown, it should be understood that a plurality of semiconductor fins can be formed on the substrate.

In one embodiment, the semiconductor fin 16 can be formed from a bulk substrate including a bulk semiconductor material throughout (not shown). In another embodiment and as shown in FIG. 1, the semiconductor fin 16 and the substrate may be provided from a semiconductor-on-insulator (SOI) substrate. The SOI substrate typically includes, from bottom to top, a handle substrate 10, a buried insulator layer 12 and a top semiconductor layer (not shown) from which the semiconductor fin 16 is formed.

The handle substrate may 10 include a semiconductor material such as, for example, Si, Ge, SiGe, SiC, SiGeC, a III-V compound semiconductor, a II-VI compound semiconductor or any combinations thereof. The handle substrate 10 provides mechanical support to the buried insulator layer 12 and the top semiconductor layer. The thickness of the handle substrate 10 can be from 30 µm to about 2 mm, although less and greater thicknesses can also be employed.

The buried insulator layer 12 may include a dielectric material such as silicon dioxide, silicon nitride, silicon oxynitride, boron nitride or a combination thereof. In one embodiment, the buried insulator layer 12 may be formed by a deposition process, such as chemical vapor deposition (CVD), plasma enhanced chemical vapor deposition (PECVD) or physical vapor deposition (PVD). In another embodiment, the buried insulator layer 12 may be formed using a thermal growth process, such as thermal oxidation, to convert a surface portion of the handle substrate 10. In yet another embodiment, the buried insulator layer 12 can also be formed by implanting oxygen atoms into the handle substrate 10 and thereafter annealing the structure. The thickness of the buried insulator layer 12 can be from 50 nm to 200 nm, although lesser or greater thicknesses can also be employed.

The top semiconductor layer (which is processed into the semiconductor fin 16) may include any semiconductor material as mentioned above for the handle substrate 10. Exemplary semiconductor materials that can be employed as the top semiconductor layer include, but are not limited to, Si, Ge, SiGe, SiC and SiGeC, and III/V compound semiconductors such as, for example, InAs, GaAs, and InP. The semiconductor materials of the top semiconductor layer and the handle substrate 10 may be the same or different. Typically, each of the handle substrate 10 and the top semiconductor layer comprises a single crystalline semiconductor material, such as, for example, single crystalline silicon. The top semiconductor layer can be formed by a deposition process, such as CVD or PECVD. The top semiconductor layer that is formed may have a thickness from 10 nm to 200 nm, although lesser or greater thicknesses can also be employed. Alternatively, the top semiconductor layer may be formed using a smart cut process where two semiconductor wafers are bonded together with an insulator in between.

In some embodiments of the present application, a hard mask layer (not shown) can be formed on the top semiconductor layer prior to forming the semiconductor fin 16. When employed, the hard mask layer may comprise an oxide, nitride, oxynitride or any combination thereof including multilayers. In one embodiment, the hard mask layer includes silicon dioxide or silicon nitride. The hard mask layer can be formed utilizing a conventional deposition process such as, for example, CVD or PECVD. Alternatively, the hard mask layer can be formed by a thermal process such as, for example, oxidation or nitridation of the top semiconductor layer. Any combination of the above mentioned processes can also be used in forming the hard mask layer. The hard mask layer that is formed can have a thickness from 20 nm to 80 nm, although lesser or greater thicknesses can also be employed.

In one embodiment, the semiconductor fin 16 can be formed by lithography and etching. The lithographic step includes applying a photoresist layer (not shown) atop the top semiconductor layer (or the hard mask, if present), exposing the photoresist layer to a desired pattern of radiation, and developing the exposed photoresist layer utilizing a conventional resist developer. The etching process comprises dry etching such as, for example, reactive ion etch (RIE) and/or wet etching. The etching process transfers the pattern from the patterned photoresist layer to the top semiconductor layer or first to the hard mask layer, if present, and thereafter to the underlying top semiconductor layer utilizing the buried insulator layer 12 as an etch stop. After transferring the pattern into the top semiconductor layer, the patterned photoresist layer can be removed utilizing a conventional resist stripping process such as, for example, ashing. Alternatively, the semiconductor fin 16 can also be formed utilizing a sidewall image transfer (SIT) process. In a typical SIT process, spacers are formed on a sacrificial mandrel. The sacrificial mandrel is removed and the remaining spacers are used as a hard mask to etch the top semiconductor layer. The spacers are then removed after the semiconductor fins have been formed. The semiconductor fin 16 can also be formed utilizing a direct self-assembly patterning process.

The semiconductor fin 16 can have a rectangular horizontal cross-sectional area. The width of the semiconductor fin 16 can be from 5 nm to 100 nm, although lesser and greater widths can also be employed. The height of the semiconductor fin 16 can be from 10 nm to 200 nm, although lesser and greater heights can also be employed.

In some embodiments of the present application and when the hard mask layer is present, the hard mask layer that remains atop the semiconductor fin 16 can be removed at this stage. The removal of the remaining non-etched portion of hard mask layer can be achieved by performing a selective etching process or by utilizing a planarization process such as chemical mechanical planarization (CMP).

Each gate structure includes a gate stack and a gate spacer 28 formed on sidewalls of the gate stack. The gate stack may include, from bottom to top, a gate dielectric 22, a gate electrode 24 and a gate cap 26. The gate stacks can be formed by first providing a material stack (not shown) that includes, from bottom to top, a gate dielectric layer, a gate electrode layer and a gate cap layer over the semiconductor fin 16 and the substrate (10, 12).

The gate dielectric layer may include an oxide, nitride or oxynitride. In one example, the gate dielectric layer may include a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed. The gate dielectric layer can be formed by any deposition technique including, for example, CVD, PECVD, PVD or atomic layer deposition (ALD). Alternatively, the gate dielectric layer can also be formed by a thermal growth process such as, for example, oxidation, nitridation or oxynitridation to convert surface portions of the semiconductor fin 16 into a dielectric material. The gate dielectric layer that is formed can have a thickness ranging from 0.5 nm to 10 nm, with a thickness from 0.5 nm to about 3 nm being more typical.

The gate electrode layer may include any conductive material including, for example, doped polysilicon, an elemental metal such as W, Ti, Ta, Al, Ni, Ru, Pd and Pt, an alloy of at least two elemental metals, a metal nitride such as WN and TiN, a metal silicide such as WSi, NiSi, and TiSi or multilayered combinations thereof. The gate electrode layer can be formed utilizing a deposition process including, for example, CVD, PECVD, PVD or ALD. In embodiments in which polysilicon or SiGe are used as the gate electrode material, an in-situ deposition process can be used or alternatively deposition followed by ion implantation can be used. The gate electrode layer that is formed can have a thickness ranging from 50 nm to 200 nm, although lesser or greater thicknesses can also be employed.

The gate cap layer may include a dielectric oxide, nitride or oxynitride. In one embodiment of the present application, the gate cap layer includes silicon nitride. The gate cap layer can be formed by a deposition process including, for example, CVD, PECVD, PVD or ALD. The gate cap layer that is formed can have a thickness ranging from 25 nm to 100 nm, although lesser or greater thicknesses can also be employed.

The material stack is then patterned and etched to form the gate stacks (22, 24, 26). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as a RIE process. Each remaining portion of the gate dielectric layer constitutes a gate dielectric 22. Each remaining portion of the gate electrode layer constitutes a gate electrode 24. Each remaining portion of the gate cap layer constitutes a gate cap 26. The remaining portions of the photoresist layer may be subsequently removed by, for example, ashing.

In one embodiment, the gate stacks (22, 24, 26) can be sacrificial gate stacks that are subsequently removed, and replaced with functional gate stacks each including a functional gate dielectric, a functional gate electrode and a functional gate cap after forming source and drain regions of the semiconductor structure.

Each gate spacer 28 may include a dielectric material such as, for example, an oxide, a nitride, an oxynitride, or any combination thereof. In one embodiment, each gate spacer 28 is composed of silicon nitride. The gate spacers 28 can be formed by first providing a conformal gate spacer material layer (not shown) on exposed surfaces of the gate stacks (22, 24, 26), the semiconductor fin 16 and the substrate (10, 12) and then etching the gate spacer material layer to remove horizontal portions of the gate spacer material layer. The gate spacer material layer can be provided by a deposition process including, for example, CVD, PECVD or ALD. The etching of the gate spacer material layer may be performed by a dry etch process such as, for example, RIE. The remaining portions of the gate spacer material layer constitute the gate spacer(s) 28. The width of each gate spacer 28, as measured at the base of the gate spacer 28 can be from 5 nm to 100 nm, although lesser and greater widths can also be employed.

Figure 2:
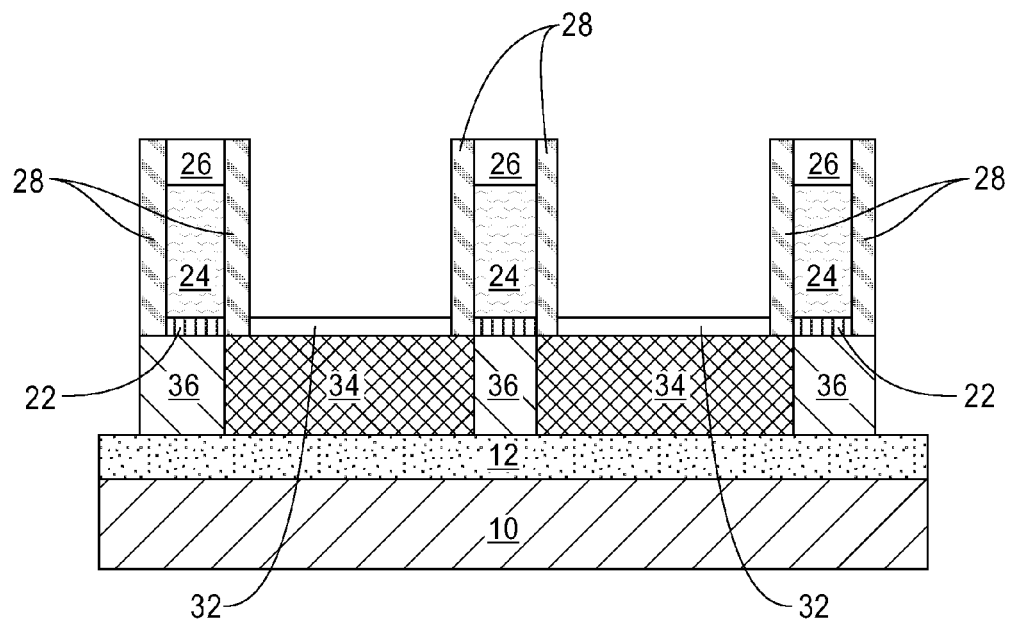
FIG. 2 is a cross-sectional view of the exemplary semiconductor structure of FIG. 1 after forming epitaxial source/drain regions and fin source/drain regions on opposite sides of the gate structures.

Referring to FIG. 2, an epitaxial source region and an epitaxial drain region (collectively referred to as epitaxial source/drain regions 32) are formed over portions of the semiconductor fin 16 located on opposite sides of each gate structure (22, 24, 26, 28). As used herein, a "source/drain" region can be a source region or a drain region depending on subsequent wiring and application of voltages during operation of a FinFET. The epitaxial source/drain regions 32 can be formed by epitaxially depositing a semiconductor material over exposed semiconductor surfaces, i.e., top and sidewall surfaces of the semiconductor fin 16, but not on dielectric surfaces such as the surfaces of the gate caps 26, the gate spacers 28 and the buried insulator layer 12. In one embodiment, the selective epitaxy growth process can proceed until the epitaxial source/drain regions 32 merge neighboring semiconductor fins (not shown).

The semiconductor material that provides the epitaxial source/drain regions 32 can include Si, Ge, SiGe or SiC. In one embodiment, the epitaxial source/drain regions 32 are composed of SiGe for formation of p-type FinFETs. In another embodiment, the epitaxial source/drain regions 32 are composed of Si for formation of n-type FinFETs.

In one embodiment, the epitaxial source/drain regions 32 can be formed with in-situ doping during the selective epitaxy process. Thus, the epitaxial source/drain regions 32 can be formed as doped semiconductor material portions. Alternatively, the epitaxial source/drain regions 32 can be formed by ex-situ doping. In this case, the epitaxial source/drain regions 32 can be formed as intrinsic semiconductor portions and n-type or p-type dopants can be subsequently introduced into the epitaxial source/drain regions 32 to convert the intrinsic semiconductor material portions into doped semiconductor material portions. Exemplary n-type dopants include, but are not limited to, P, As and Sb. Exemplary p-type dopants include, but are not limited to, Al, B, Ga and In.

If ex-situ doping is employed, ion implantation or gas phase doping can also introduce dopants into portions of the semiconductor fin 16 that do not underlie the gate stacks (22, 24, 26). The resulting doped portions within the semiconductor fin 16 are herein referred to fin source/drain regions 34. If in-situ doping is employed, an anneal process can be performed to outdiffuse dopants from the epitaxial source/drain regions 32 into underlying portions of the semiconductor fin 16 to form the fin source/drain regions 34. The epitaxial source/drain regions 32 and the fin source/drain regions 34 together constitute source/drain regions for Fin-FETs. A remaining portion of the semiconductor fin 16 that is located beneath a corresponding gate stack (22, 24, 26) constitutes a channel region 36 of a FinFET.

Figure 3:
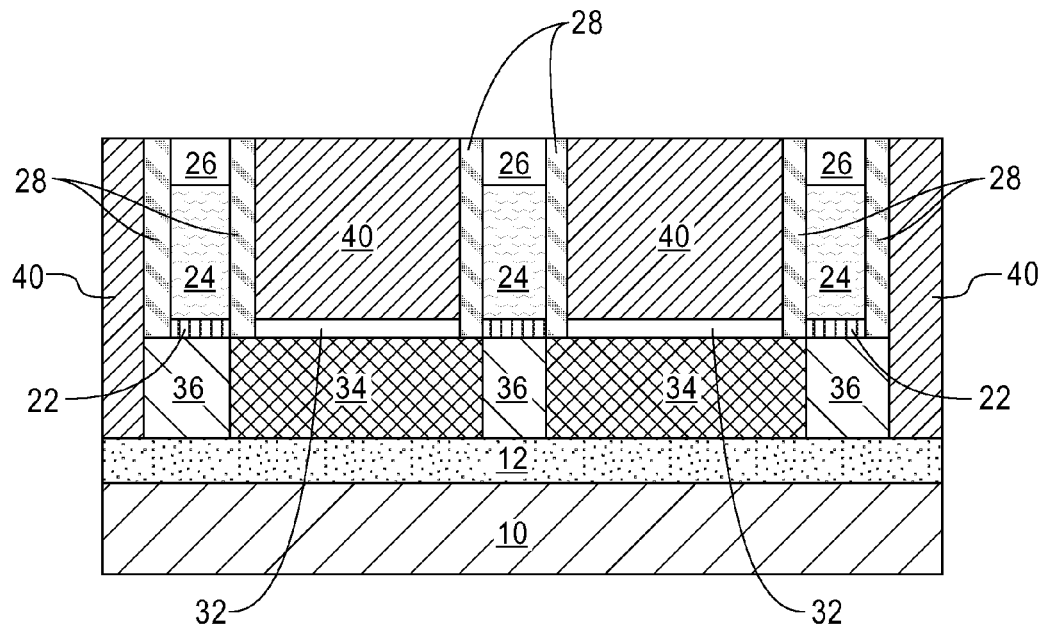
FIG. 3 is a cross-sectional view of the exemplary semiconductor structure of FIG. 2 after forming an interlevel dielectric (ILD) layer over the epitaxial source/drain regions and the substrate to laterally surround the gate structures.

Referring to FIG. 3, an interlevel dielectric (ILD) layer 40 is formed over the epitaxial source/drain regions 32 and the buried insulator layer 12 and laterally surrounds the gate structures (22, 24, 26, 28). In some embodiments of the present application, the ILD layer 40 is composed of a dielectric material that may be easily planarized. For example, the ILD layer 40 can include a doped silicate glass, an undoped silicate glass (silicon oxide), an organosilicate glass (OSG), a porous dielectric material, or amorphous carbon. The ILD layer 40 can be deposited using a conventional deposition process such as, for example, CVD, PECVD or spin coating. If the ILD layer 40 is not self-planarizing, and following the deposition of the ILD layer 40, the ILD layer 40 can be subsequently planarized, for example, by chemical mechanical planarization (CMP) using the topmost surfaces of the gate stacks (22, 24, 26) (i.e., the top surfaces of the gate caps 26) as an etch stop so that a top surface of the ILD layer 40 is coplanar with the top surfaces of the gate caps 26.

Figure 4:
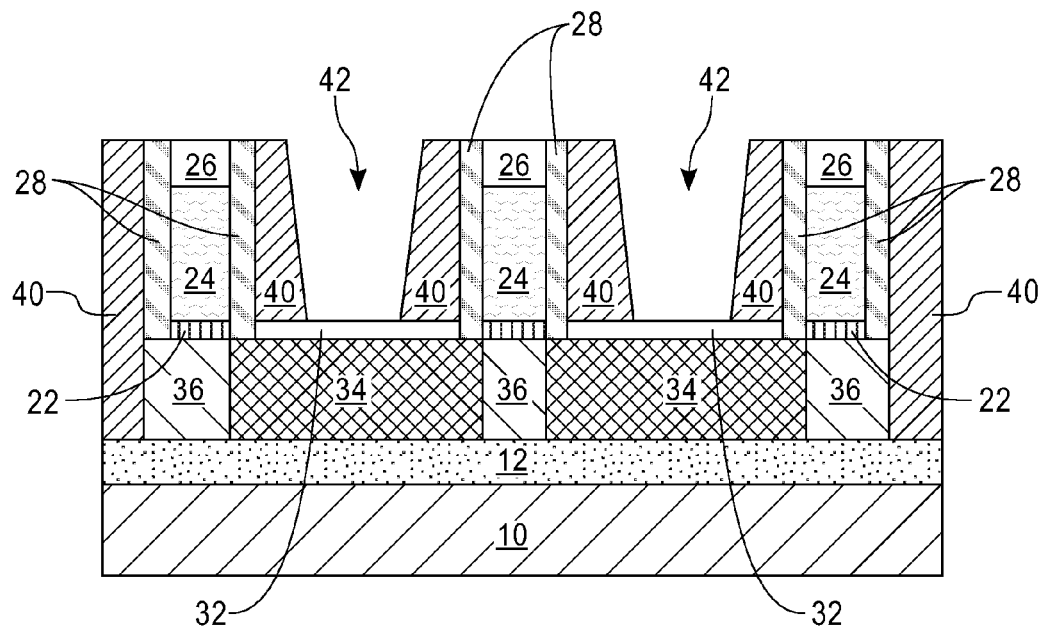
FIG. 4 is a cross-sectional view of the exemplary semiconductor structure of FIG. 3 after forming a trench contact opening through the ILD layer to expose at least a portion of each epitaxial source/drain region.

Referring to FIG. 4, trench contact openings 42 are formed extending through the ILD layer 40. Each trench contact opening 42 exposes at least a portion of one of the epitaxial source/drain regions 32. The trench contact openings 42 can be formed by applying a mask layer (not shown) over the ILD layer 40 and the gate structures (22, 24, 26, 28), and then lithographically patterning the mask layer to form openings therein. Each opening overlies at least a portion of one of the epitaxial source/drain regions 32. The mask layer can be a photoresist layer or a photoresist layer in conjunction with hardmask layer(s). The pattern in the mask layer is transferred through the ILD layer 40 to form the trench contact openings 42. In one embodiment of the present application, a RIE may be performed to remove exposed portions of the ILD layer 40 to expose epitaxial source/drain regions 32 within the trench contact openings 42. After forming the trench contact openings 42, the remaining mask layer can be removed by oxygen-based plasma etching.

Figure 5:
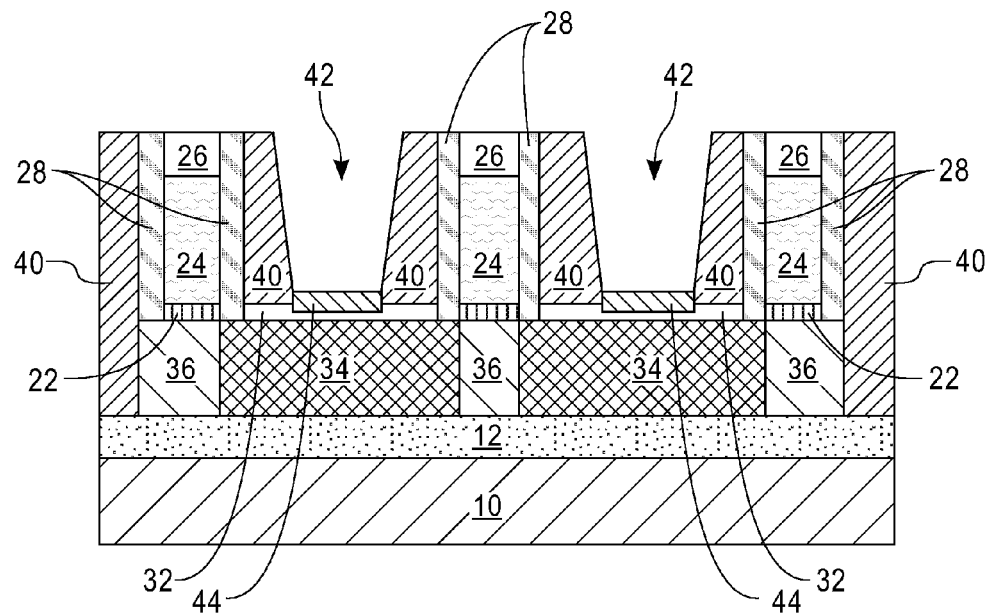
FIG. 5 is a cross-sectional view of the exemplary semiconductor structure of FIG. 4 after forming a metal semiconductor alloy region on each epitaxial source/drain region.

Referring to FIG. 5, a metal semiconductor alloy region 44 is formed at a bottom of each trench contact opening 42. The metal semiconductor alloy regions 44 may be composed of a silicide or germicide. In one embodiment, the metal semiconductor alloy regions 44 can be formed by first depositing a metal layer along sidewalls and bottoms of the trench contact openings 42 and over top surfaces of the ILD layer 40 and the gate structures (22, 24, 26, 28). The metal layer may include a metal such as Ni, Co, Pt, W, Ti, Ta, a rare earth metal (e.g., Er, Yt, La), an alloy thereof, or any combination thereof. The metal layer may be deposited by CVD, PVD or ALD. The thickness of the metal layer can be from 2 nm to 10 nm, although lesser and grater thicknesses can also be employed.

An anneal is subsequently performed at an elevated temperature to induce reaction of the semiconductor material of the epitaxial source/drain regions 32 exposed at the bottom of the trench contact openings 42 and the metal in the metal layer to provide the metal semiconductor alloy regions 44. The unreacted portion of the metal layer is then removed, for example, by an etch, which can be a wet etch that removes the metal in the metal layer selective to the metal semiconductor alloy in the metal semiconductor alloy regions 44. The wet etch can be combined with a post-clean that removes any remnants of the metal layer from the exposed surfaces of the ILD layer 40 in the trench contact openings 42. In some embodiments of the present application, the metal semiconductor alloy regions 44 can be formed in later processes after formation of trench contact structures within the trench contact openings 42 and the processing steps described in FIG. 5 to form the metal semiconductor alloy regions 44 can be omitted entirely.

Figure 6:
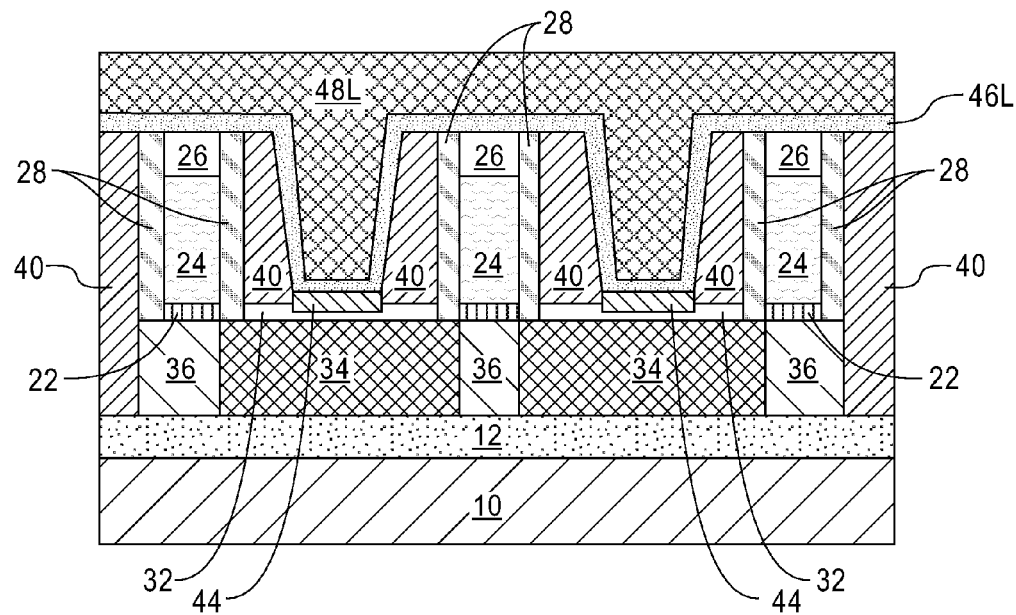
FIG. 6 is a cross-sectional view of the exemplary semiconductor structure of FIG. 5 after forming a first contact liner layer along sidewalls and bottom portions of the trench contact openings and over the ILD layer, and forming a first contact conductive layer over the first contact liner layer.

Referring to FIG. 6, a first contact liner layer 46L is deposited along sidewalls and bottoms of the trench contact openings 42 and over the top surface of the ILD layer 40. In one embodiment, the first contact liner layer 46L may include Ti, Ta, Ni, Co, Pt, W, TiN, TaN, WN, WC, an alloy thereof, or a stack thereof such as Ti/TiN and Ti/WC. The first contact liner layer 46L may be formed utilizing a conformal deposition process including CVD or ALD. The first contact liner layer 46L that is formed can have a thickness ranging from 1 nm to 5 nm, although lesser and greater thicknesses can also be employed.

A first contact conductive layer 48L is subsequently deposited on the first contact liner layer 46L to completely fill the trench contact openings 42. The first contact conductive layer 48L may include a metal such as, for example, Cu, W, Al, Co, Ru, Mo, Os, Ir, Rh or an alloy thereof. The first contact conductive layer 48L can be formed by any suitable deposition method such as, for example, CVD, PVD or plating.

Figure 7:
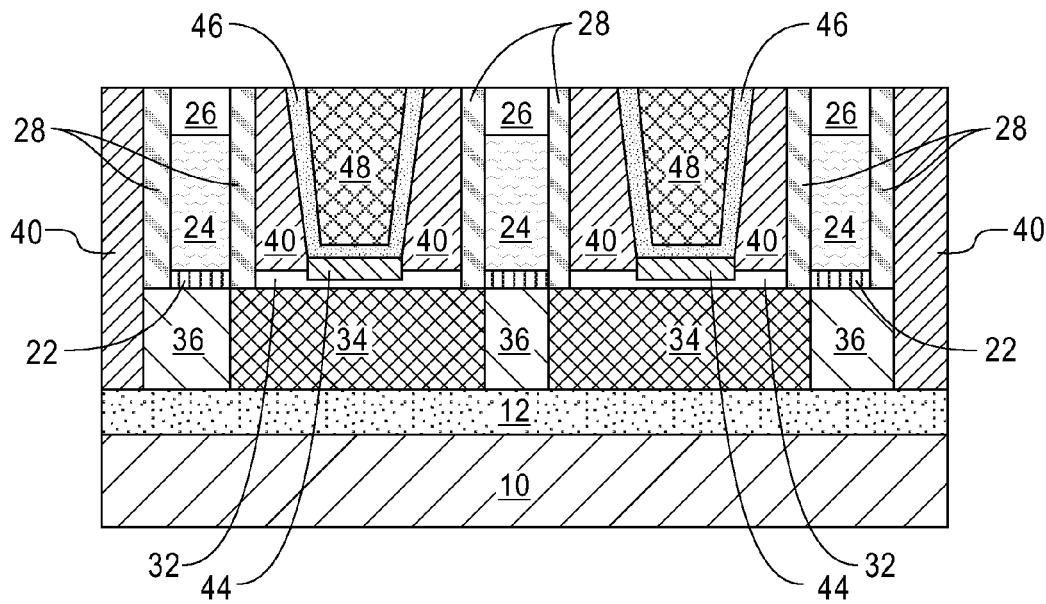
FIG. 7 is a cross-sectional view of the exemplary semiconductor structure of FIG. 6 after forming a trench contact structure including a trench contact liner portion and a trench contact conductor portion within each trench contact opening.

Referring to FIG. 7, portions of the first contact conductive layer 48L and the first contact liner layer 46L that are located above the top surface of the ILD layer 40 are removed by employing a planarization process, such as, for example, CMP. Remaining portions of the first contact liner layer 46L located within the trench contact openings 42 constitute trench contact liner portions 46, while remaining portions of the first contact conductive layer 48L located within the trench contact openings 42 constitute trench contact conductor portions 48. The top surfaces of the trench contact liner portions 46 and the trench contact conductor portions 48 are coplanar with the top surface of the ILD layer 40. A trench contact liner portion 46 and an overlying trench contact conductor portion 48 within each trench contact opening 42 together define a trench contact structure. The trench contact structure (46, 48) is in direct contact with a source/drain region (32, 34) or a metal semiconductor alloy region 44, if present, that is located at the bottom of each source/drain contact trench 44.

In instances where the trench contact liner layer 46L has a bilayer structure composed of for example, Ti/TiN or Ti/WC, after formation of trench contact structures (46, 48), the entire structure can be annealed, for example, by a thermal annealing process or a laser annealing process to induce the reaction of the elemental metal in a lower liner layer (not shown) of the trench contact liner layer 46L and the semiconductor material that provides the epitaxial source/drain regions 32. The metal semiconductor alloy regions 44 can thus be formed between the trench contact structures (46, 48) and the epitaxial source/drain regions 32.

Figure 8:
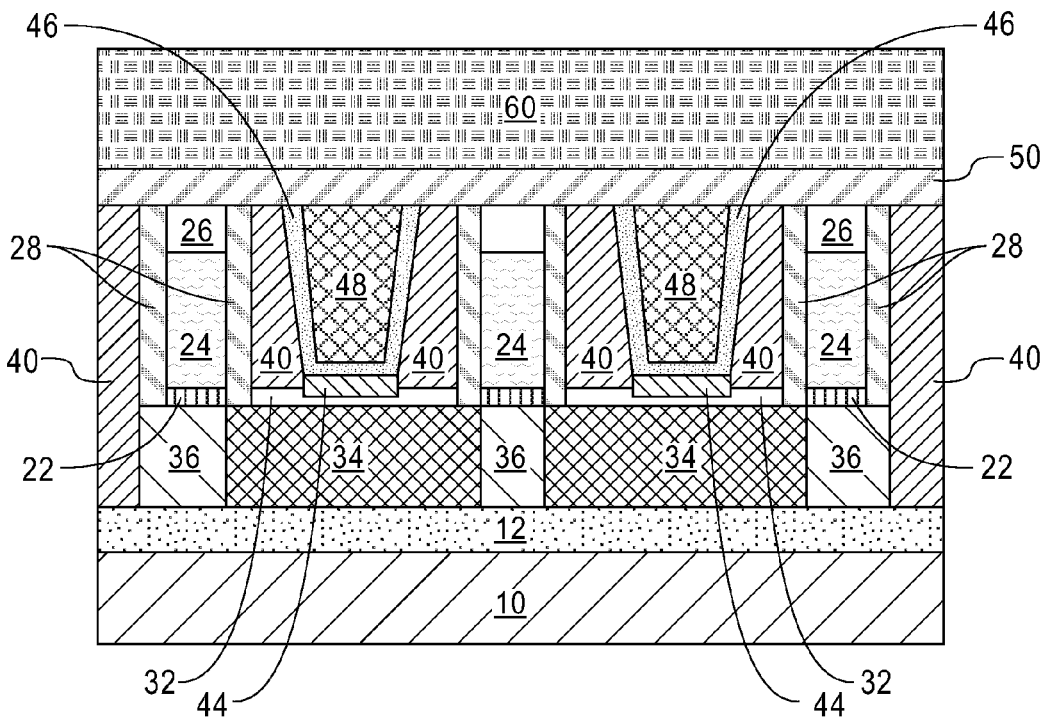
FIG. 8 is a cross-sectional view of the exemplary semiconductor structure of FIG. 7 after forming a first dielectric cap layer over the trench contact liner portions, the trench contact conductor portions, the gate structures and the ILD layer and forming a first contact level dielectric layer over the first dielectric cap layer.

Referring to FIG. 8, a first dielectric cap layer 50 is deposited over the gate structures (22, 24, 26, 28), the trench contact structures (46, 48) and the ILD layer 40. The first dielectric cap layer 50 protects underlying gate structures (22, 24, 26, 28) and trench contact structures (46, 48) from impurities that may diffuse down from upper levels, and can function as a diffusion barrier layer that prevents vertical diffusion of metallic impurities, moisture, or other gaseous impurities. The first dielectric cap layer 50 may include, for example, silicon nitride, silicon oxynitride, silicon carbide, nitrogen and hydrogen doped silicon carbide (SiCNH), or a combination thereof. The first dielectric cap layer 50 may be formed, for example, by CVD or ALD. The thickness of the first dielectric cap layer 50 can be from 25 nm to 50 nm, although lesser and greater thicknesses can also be employed. The first dielectric cap layer 50 is optional and can be omitted in some embodiments of the present application.

Next, a first contact level dielectric layer 60 is deposited over the first dielectric cap layer 50. The first contact level dielectric layer 60 typically includes a low-k dielectric material. By "low-k" it is meant a dielectric material having a dielectric constant that is about 4.0 or less. Exemplary low-k dielectric materials include, but are not limited to, silicon dioxide, organosilicates, silsequioxanes, undoped silicate glass (USG), fluorosilicate glass (FSG), SiCOH and borophosphosilicate glass (BPSG). The first contact level dielectric layer 60 can be formed by CVD, PVD or spin coating. If the first contact level dielectric layer 60 is not self-planarizing, the top surface of the first contact level dielectric layer 60 can be planarized, for example, by CMP. The planarized top surface of the first contact level dielectric layer 60 is located above the top surface of the first dielectric cap layer 50. The first contact level dielectric layer 60 may have a thickness ranging from 50 nm to 200 nm, although lesser and greater thicknesses can also be employed.

Figure 9:
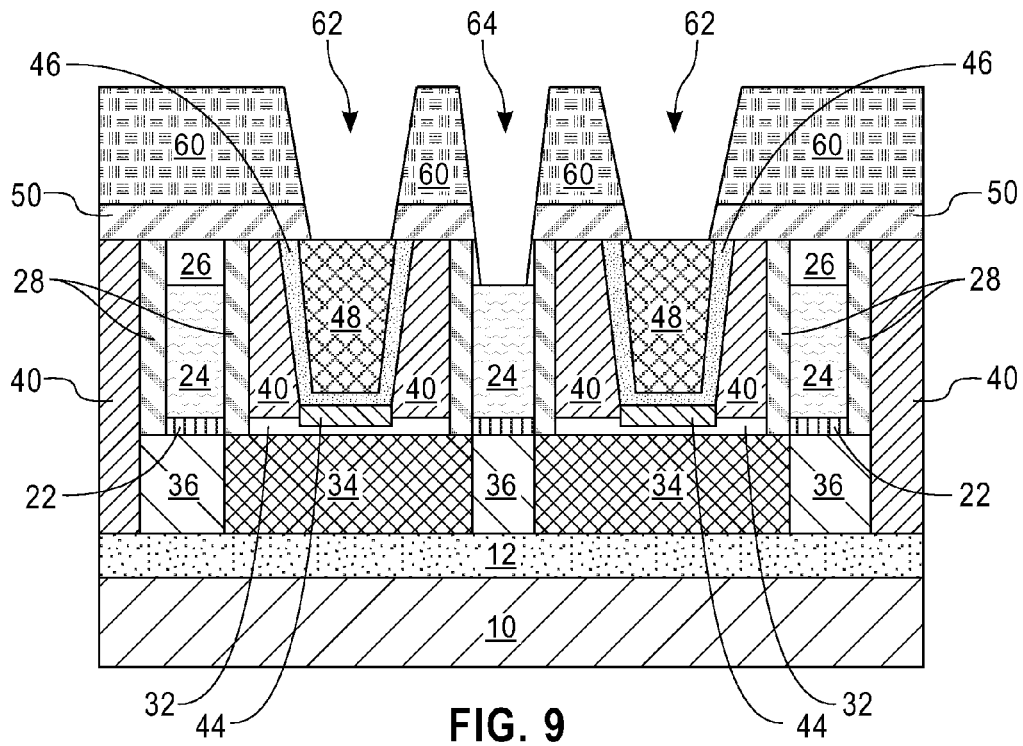
FIG. 9 is a cross-sectional view of the exemplary semiconductor structure of FIG. 8 after forming CA contact openings through the first contact level dielectric layer and the first dielectric cap layer to expose the trench contact conductor portions, and a CB contact opening through the first contact level dielectric layer and the first dielectric cap layer to expose a gate electrode in one of the gate structure.

Referring to FIG. 9, local contact openings are formed. The local contact openings include CA contact openings 62 extending through the first contact level dielectric layer 60 and the first dielectric cap layer 50, and a CB contact opening 64 extending through the first contact level dielectric layer 60, the first dielectric cap layer 50 and the gate cap 26. Each CA contact opening 62 exposes at least a portion of the trench contact conductor portion 48 in each trench contacts structure (46, 48) and is used to form a CA contact structure that provides electrical contact to one of the trench contact structures (46, 48). The CB contact opening 64 exposes at least a portion of a gate electrode 24 in one of the gate structures (22, 24, 26, 28) located between the trench contact structures (46, 48) and is used to form a CB contact structure that provides electrical contact to the gate structure (22, 24, 26, 28).

The CA and CB contact openings 62, 64 can be formed by a combination of lithographic patterning and anisotropic etch. A mask layer (not shown) is formed over the first contact level dielectric layer 60, and then lithographically patterned to form openings therein. The openings overlie areas in which formation of the CA and CB contact openings 62, 64 are desired. The mask layer can be a photoresist layer or a photoresist layer in conjunction with hard mask layer(s). The pattern in the mask layer is transferred through the first contact level dielectric layer 60, the first dielectric cap layer 50 and the gate cap 26 by at least one anisotropic etch to provide the CA and CB contact openings 62, 64. The at least one anisotropic etch can be a dry etch or a wet etch that removes the dielectric materials of the first contact level dielectric layer 60, the first dielectric cap layer 50 and the gate cap 26 selective to the conductive materials of the trench contact conductor portions 48 and the gate electrode 24. After forming the CA and CB contact openings 62, 64, the remaining portions of the mask layer can be removed by oxygen-based plasma etching.

Figure 10:
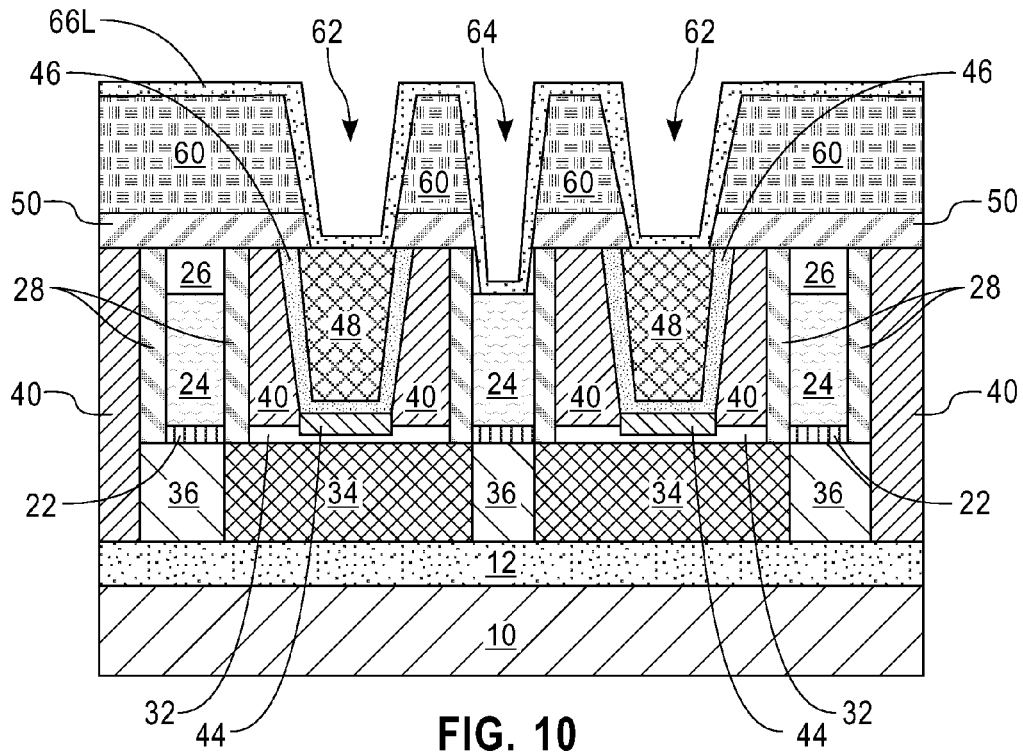
FIG. 10 is a cross-sectional view of the exemplary semiconductor structure of FIG. 9 after forming a second contact liner layer along sidewalls and bottoms of the CA and CB contact openings and over the first conductive level dielectric layer.

Referring to FIG. 10, a second contact liner layer 66L is deposited along sidewalls and bottoms of the CA and CB contact openings 62, 64 and over the top surface of the first contact level dielectric layer 60. The second contact liner layer 66L may include a metal the same as, or different from, the first contact liner layer 46L. For example, the second contact liner layer 66L may include Ti, Ta, Ni, Co, Pt, W, TiN, TaN, WN, WC, an alloy thereof or a stack thereof such as Ti/TiN and Ti/WC and may be formed by CVD or ALD.

Figure 11:
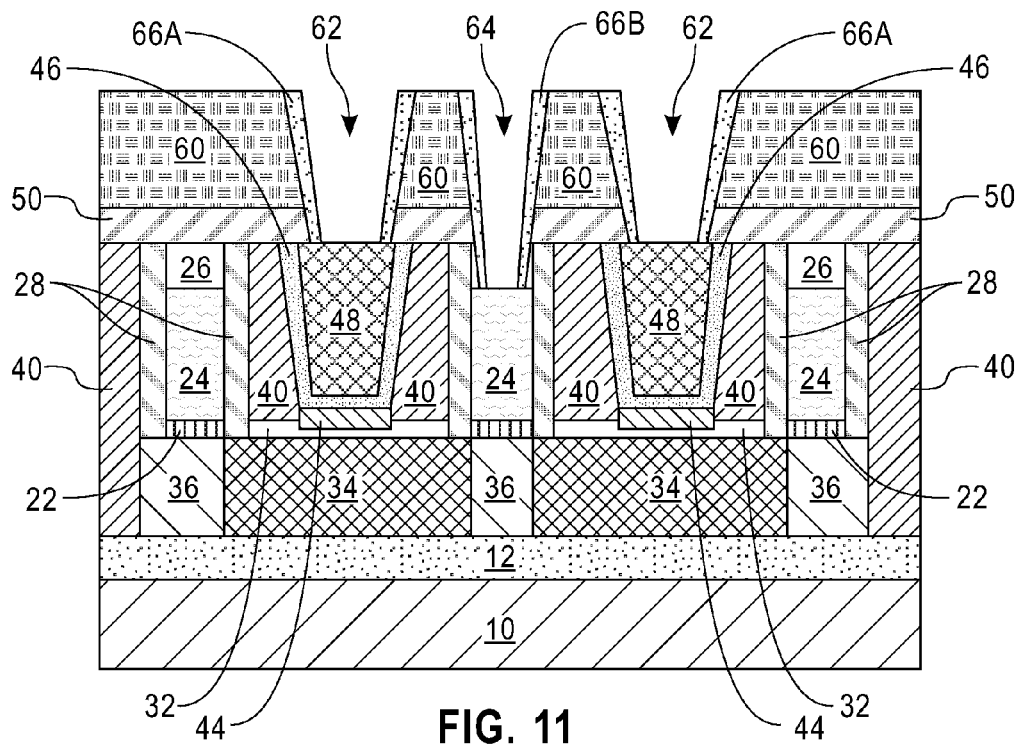
FIG. 11 is a cross-sectional view of the exemplary semiconductor structure of FIG. 10 after forming CA contact liner portions on the sidewalls of the CA contact openings, and CB contact liner portions on the sidewalls of the CB contact opening.

Referring to FIG. 11, horizontal portions of the second contact liner layer 66L that are located over the top surface of the first contact level dielectric layer 60 and the bottom surfaces of the CA and CB contact trenches 62, 64 are removed by an anisotropic etch. In one embodiment, an Ar plasma based sputter etching process can be employed. The removal of the second contact liner layer 66L from bottom surfaces of the CA contact openings 62 re-exposes the trench contact conductor portions 48, while the removal of the second contact liner layer 66L from the bottom surface of the second local contact opening 64 re-exposes the gate electrode 24. The remaining portions of the second contact liner layer 66L present on sidewalls of the CA contact openings 62 constitute CA contact liner portions 66A, while the remaining portions of the second contact liner layer 66L present on sidewalls of the CB contact opening 64 constitutes CB contact liner portions 66B.

After formation of the CA and CB contact liner portions 66A, 66B, a wet cleaning may be performed to remove any organic or metallic contaminants from the exposed surfaces of the trench contact conductor portions 48 and the gate electrode 24. In one embodiment, an etchant solution of phosphoric acid, chromium trioxide and water may be employed in the wet cleaning process. The wet cleaning process is optional and can be omitted in some embodiments of the present application.

Figure 12:
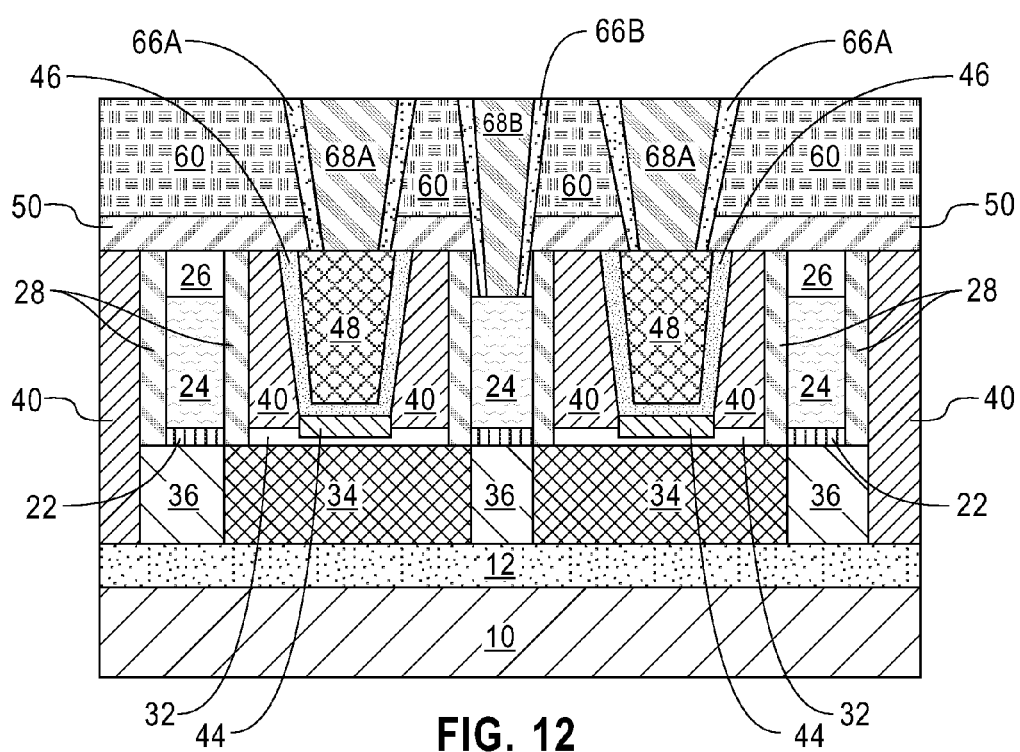
FIG. 12 is a cross-sectional view of the exemplary semiconductor structure of FIG. 11 after forming CA contact conductor portions within the CA contact openings, and a CB contact conductor portion within the CB contact opening.

Referring to FIG. 12, a CA contact conductor portion 68A is formed over the CA contact liner portions 66A and the trench contact conductor portion 48 to fill a remaining volume of each CA contact opening 62. A CB contact conductor portion 68B is formed over the CB contact liner portions 66B and the gate electrode 24 to fill a remaining volume of the CB contact opening 64. The CA and CB contact conductor portions 68A, 68B can be formed by first depositing a second contact conductive layer (not shown) over the CA and CB contact liner portions 66A, 66B, the trench contact conductor portions 48, the gate electrode 24 and the first contact level dielectric layer 60 to completely fill the CA and CB contact openings 62, 64. The second contact conductive layer may include a metal such as, for example, Cu, W, Al, Co, Ru, Mo, Os, Ir, Rh or an alloy thereof. The conductive material that provides the second contact conductive layer can be the same, or different from, that of the first contact conductive layer 48L. The second contact conductive layer can be formed by, CVD, PVD or plating.

Portions of the second contact conductive layer that are located above the top surface of the first contact level dielectric layer 60 are subsequently removed by employing a planarization process such as, for example, CMP. The remaining portions of the second contact conductive layer located within the CA contact openings 62 constitute the CA contact conductor portions 68A, and the remaining portion of the second contact conductive layer located within the CB contact opening constitutes the CB contact conductor portion 68B.

Thus, a CA contact structure is formed above each of source/drain regions (32, 34) and within each CA contact opening 62 to provide electrical contact to each trench contact structure (46, 48), and a CB contact structure is formed within the CB contact opening 64 to provide electrical contact to one of the gate structure (22, 24, 26, 28). Each CA contact structure includes CA contact liner portions 66A present on sidewalls of each CA contact opening 62 and a CA contact conductor portion 68A laterally surrounded by the CA contact liner portions 66A and vertically contacting the trench contact conductor portion 48 of one of the trench contact structures (46, 48). The CB contact structure includes CB contact liner portions 66B present on sidewalls of the CB contact opening 64 and a CB contact conductor portion 68B laterally surrounded by the CB contact liner portions 66B and vertically contacting the gate electrode 24 of the gate structure (22, 24, 26, 28) located between the trench contact structures (46, 48).

Figure 13:
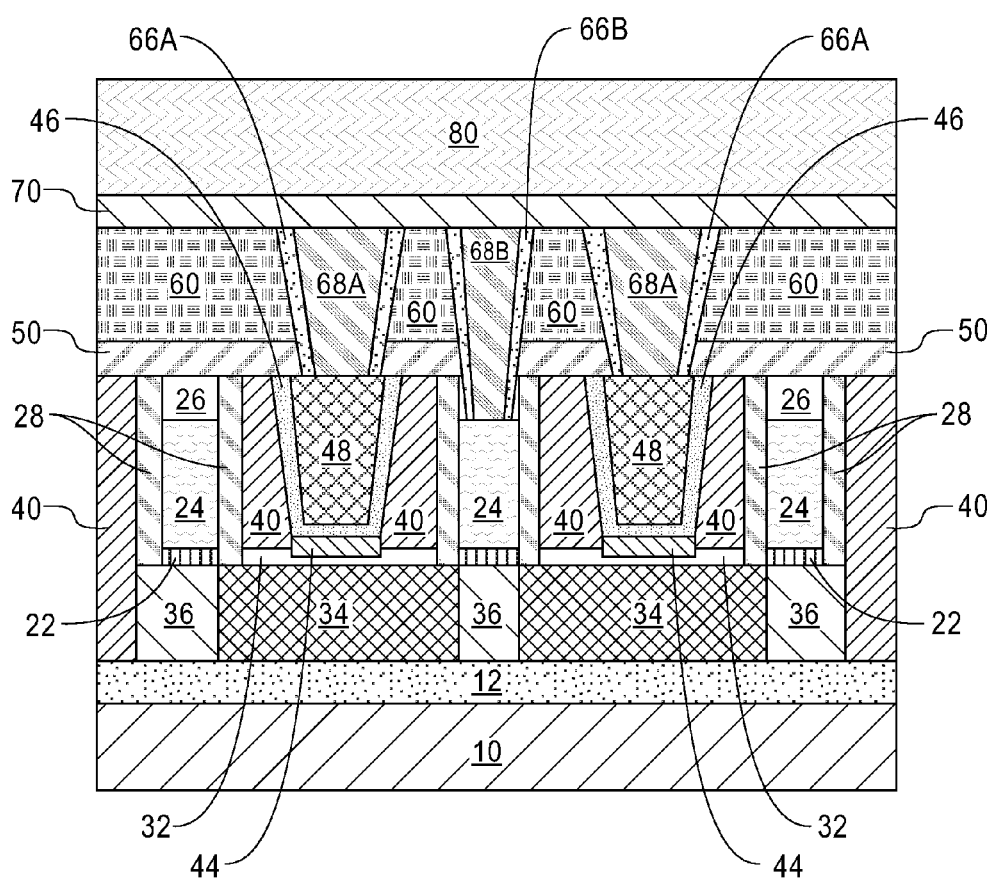
FIG. 13 is a cross-sectional view of the exemplary semiconductor structure of FIG. 12 after forming a second dielectric cap layer over CA and CB contact liner portions, CA and CB contact conductor portions and the first contact level dielectric layer, and forming a second contact level dielectric layer over the second dielectric cap layer.

Referring to FIG. 13, a second dielectric cap layer 70 and a second contact level dielectric layer 80 are subsequently deposited over the CA and CB contact structures (66A, 68A, 66B, 68B) and the first contact level dielectric layer 60. The second dielectric cap layer 70 may include a dielectric material the same as, or different from the dielectric material providing the first dielectric cap layer 50. For example, the second dielectric cap layer 70 may include silicon nitride, silicon oxynitride, silicon carbide, SiCNH, or a combination thereof. The second dielectric cap layer 70 may be formed, for example, by CVD or ALD. The thickness of the second dielectric cap layer 70 thus formed can be from 25 nm to 50 nm, although lesser and greater thicknesses can also be employed. The second dielectric cap layer 50 is optional and can be omitted in some embodiments of the present application.

The second contact level dielectric layer 80 may include a dielectric material the same as, or different from the dielectric material providing the first contact level dielectric layer 60. For example, the second contact level dielectric layer 80 may include silicon dioxide, organosilicates, silsesquioxanes, USG, FSG, SiCOH or BPSG. The second contact level dielectric layer 80 may be formed, for example, by CVD or ALD. The thickness of the second contact level dielectric layer 80 thus formed can be from 50 nm to 200 nm, although lesser and greater thicknesses can also be employed.

Figure 14:
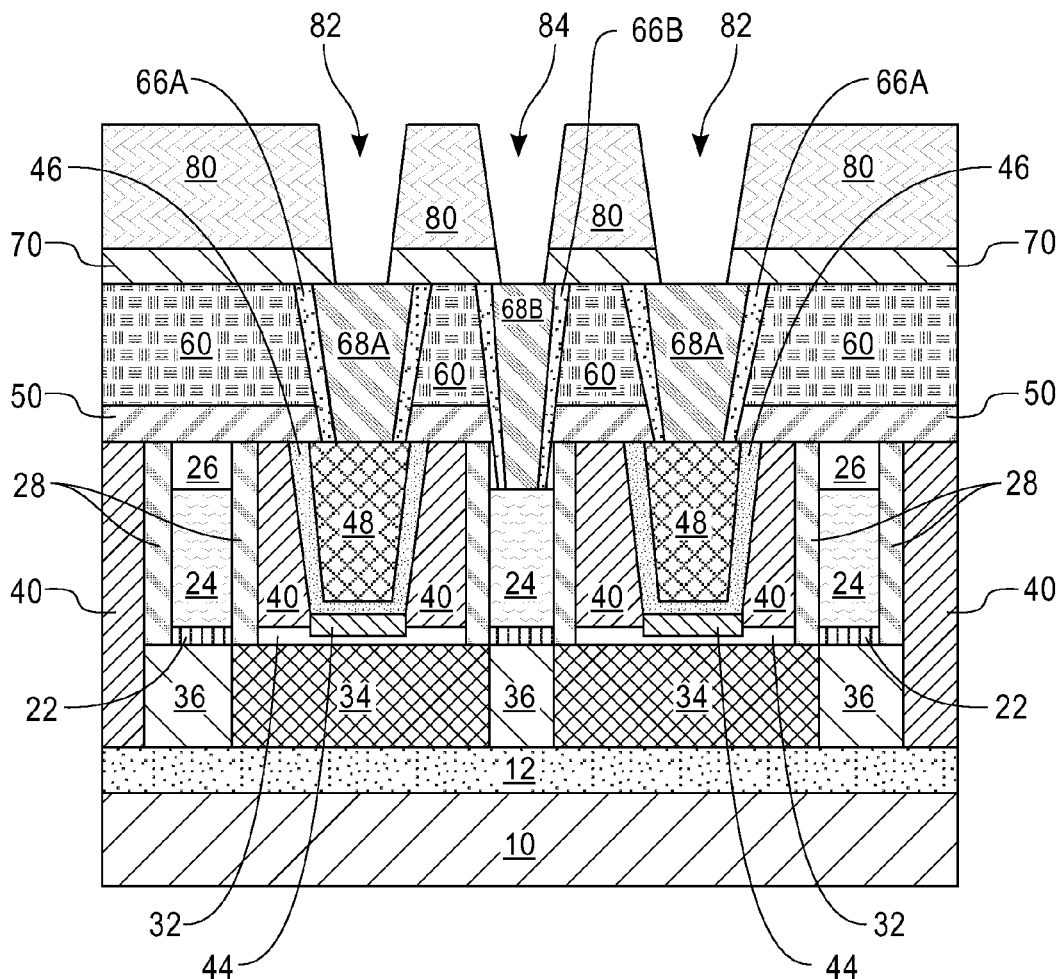
FIG. 14 is a cross-sectional view of the exemplary semiconductor structure of FIG. 13 after forming first interconnect openings through the second contact level dielectric layer and the second dielectric cap layer to expose the CA contact conductor portions and a second interconnect opening through the first contact level dielectric layer and the first dielectric cap layer to expose the CB contact conductor portions.

Referring to FIG. 14, interconnect openings including first interconnect openings 82 and a second interconnect opening 84 are formed extending through the second contact level dielectric layer 80 and the second dielectric cap layer 70. Each first interconnect opening 82 exposes a portion of the CA contact conductor portion 68A in one of the CA contact structures (66A, 68A), and the second interconnect opening 84 exposes a portion of the CB contact conductor portion 68B in the CB contact structure (66B, 68B). The first and second interconnect openings 82, 84 can be formed by performing processing steps described above in FIG. 9.

Figure 15:
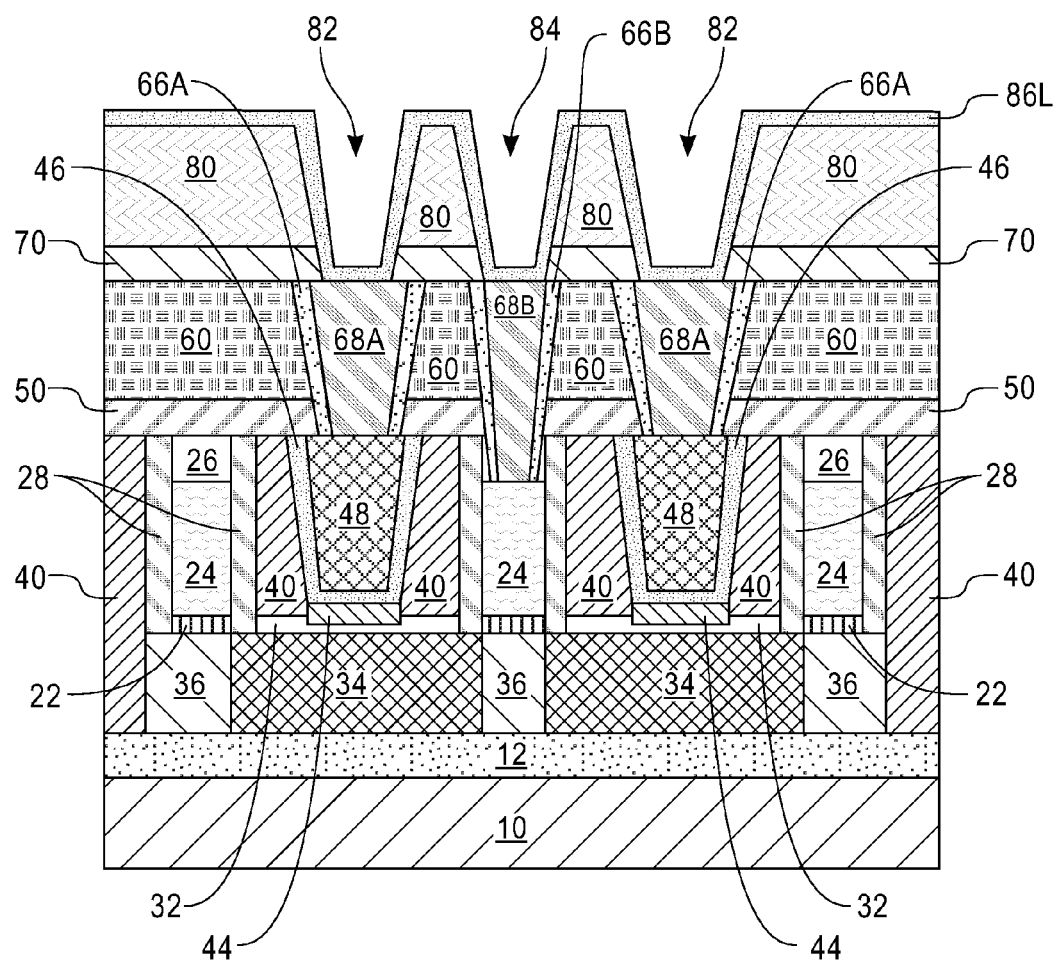
FIG. 15 is a cross-sectional view of the exemplary semiconductor structure of FIG. 14 after forming a third contact liner layer along sidewalls and bottom portions of the first and second interconnect contact openings and over the second conductive level dielectric layer.

Referring to FIG. 15, a third contact liner layer 86L is deposited along sidewalls and bottoms of the first and second interconnect openings 82, 84 and over the top surface of the second contact level dielectric layer 80 by performing processing steps described above in FIG. 10. The third contact liner layer 86L may include a metal the same as, or different from, the second contact liner layer 66L. For example, the third contact liner layer 86L may include Ti, Ta, Ni, Co, Pt, W, TiN, TaN, WN, WC, an alloy thereof, or a stack thereof such as Ti/TiN and Ti/WC.

Figure 16:
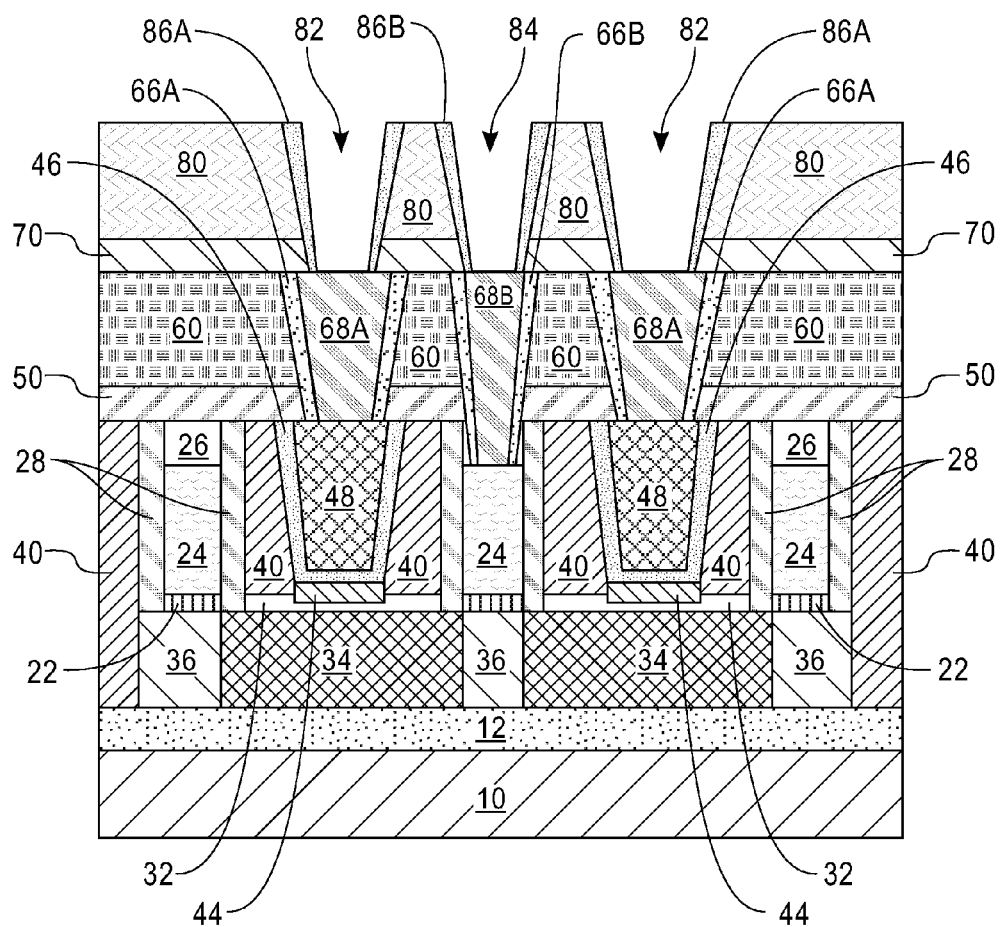
FIG. 16 is a cross-sectional view of the exemplary semiconductor structure of FIG. 15 after forming first interconnect liner portions on the sidewalls of the first interconnect openings and second interconnect liner portions on the sidewalls of the second interconnect opening.

Referring to FIG. 16, horizontal portions of the third contact liner layer 86L that are located over the top surface of the second contact level dielectric layer 80 and the bottom surfaces of the first and second interconnect contact trenches 82, 84 are removed by performing processing steps described above in FIG. 11. The removal of the third contact liner layer 86L from bottom surfaces of the first interconnect openings 82 re-exposes the CA contact conductor portions 68 in the CA contact structures (66A, 68A), while the removal of the third contact liner layer 86L from the bottom surface of the second interconnect opening 84 re-exposes the CB contact conductor portions 68B in the CB contact structure (66B, 68B). The remaining portions of the third contact liner layer 86L present on sidewalls of the first interconnect openings 82 constitute first interconnect liner portions 86A. The remaining portions of the third contact liner layer 86L present on sidewalls of the second interconnect opening 84 constitute second interconnect liner portions 86B.

After formation of the interconnect liner portions 86A, 86B, a wet cleaning process described above in FIG. 11 may be performed to remove any organic or metallic contaminants from the exposed surfaces of the CA and CB contact conductor portions 68A, 68B. The wet cleaning process is optional and can be omitted in some embodiments of the present application.

Figure 17:
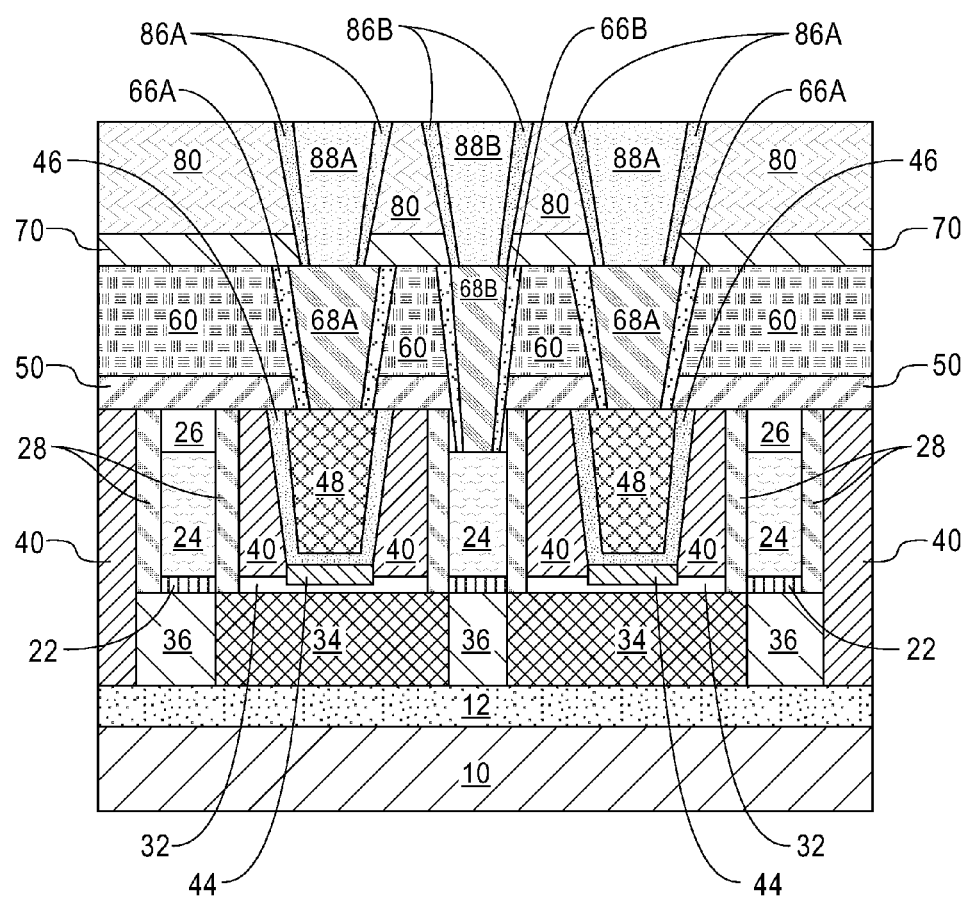
FIG. 17 is a cross-sectional view of the exemplary semiconductor structure of FIG. 16 after forming first interconnect conductor portions within the first interconnect openings and a second interconnect conductor portion within the second interconnect opening.

Referring to FIG. 17, a first interconnect conductor portion 88A is formed over the first interconnect liner portions 86A and the CA contact conductor portion 68A to fill a remaining volume of each first interconnect opening 82. A second interconnect conductor portion 88B is formed over the second interconnect liner portions 86B and the CB contact conductor portion 68B to fill a remaining volume of the second interconnect opening 84. The first and second interconnect conductor portions 88A, 88B can be formed by performing processing steps described above in FIG. 12. For example, a third contact conductive layer (not shown) is formed over the first and second interconnect liner portions 86A, 86B, the CA and CB contact conductor portions 68A, 68B and the second contact level dielectric layer 80 and subsequently removed from the top surface of the second contact level dielectric layer 80. The third contact conductive layer may include a conductive material the same as, or different from, that of the second contact conductive layer. For example, the third contact conductive layer may include Cu, W, Al, Co, Ru, Mo, Os, Ir, Rh or an alloy thereof.

First level interconnect structures are thus formed. The first level interconnect structures includes a first interconnect structure located within each first interconnect opening 82 and in direct contact with each CA contact structure (66A, 68A), and a second interconnect structure located within the second interconnect opening 84 and in direct contact with the CB contact structure (66B, 68B). Each first interconnect structure includes first interconnect liner portions 86A present on sidewalls of each first interconnect opening 82 and a first interconnect conductor portion 88A laterally surrounded by the first contact liner portions 86A and vertically contacting the CA contact conductor portion 68A of each CA contact structure (66A, 68A). The second interconnect structure includes second interconnect liner portions 86B present on sidewalls of the second interconnect opening 84 and a second interconnect conductor portion 88B laterally surrounded by the second interconnect liner portions 68 and vertically contacting the CB contact conductor portion 68B of the CB contact structure (66B, 68B).

The processing steps described above for formation of first level interconnect structures can be repeated to form multi-level interconnect structures.

Multi-level source/drain contact structures each including a stack of, from bottom to top, a CA contact structure (66A, 68A) and a first interconnect structure (86A, 88A) are thus formed to provide electrical contact to trench contact structures (46, 48) that form ohmic contact with the source/drain regions (32, 34). Since no contact liner material is present at interfaces between conductor portions (i.e., an interface between the first interconnect conductor portion 88A and the CA contact conductor portion 68A as well as an interface between the CA contact conductor portion 68A and the trench contact conductor portion 48) in different metallization layers, the contact resistance of the multi-level source/drain contact structure is reduced.

A multi-level gate contact structure including a stack of, from bottom to top, a CB contact structure (66B, 68B) and a second interconnect structure (86B, 86A) are thus formed to provide electrical contact to a gate structure (22, 24, 26). Since no contact liner material is present at interfaces between conductor portions (i.e., an interface between the second interconnect conductor portion 88B and the CB contact conductor portion 68B as well as an interface between the CB contact conductor portion 68B and the gate electrode 24) in different metallization layers, the contact resistance of the multi-level gate contact structure is reduced. Reducing contact resistance improves device speed, therefore increasing device performance.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a gate structure located over a channel region of a semiconductor fin and laterally surrounded by an inter-level dielectric (ILD) layer, wherein a gate dielectric spacer is present along sidewalls of the gate structure;
   source/drain regions located on opposite sides of the gate structure;
   a trench contact structure embedded within the ILD layer and contacting each of the source/drain regions, wherein the ILD layer has a topmost surface that is coplanar with a topmost surface of the gate dielectric spacer;
   a multi-level source/drain contact structure overlying the trench contact structure and comprising a stack of a CA contact structure and a first interconnect contact structure overlying the CA contact structure, wherein the CA contact structure comprises a CA contact conductor portion in direct contact with a trench contact conductor portion in the trench contact structure and CA contact liner portions laterally surrounding the CA contact conductor portion, and the first interconnect contact structure comprises a first interconnect conductor portion in direct contact with the CA contact conductor portion and first interconnect liner portions laterally surrounding the first interconnect conductor portion; and a multi-level gate contact structure overlying the gate structure and comprising a stack of a CB contact structure and a second interconnect contact structure overlying the CB contact structure, wherein the CB contact structure comprises a CB contact conductor portion in direct contact with a gate electrode in the gate structure and CB contact liner portions laterally surrounding the CB contact conductor portion, and the second interconnect contact structure comprises a second interconnect conductor portion in direct contacting the CB contact conductor portion and second interconnect liner portions laterally surrounding the second interconnect conductor portion.

2. The semiconductor structure of claim 1, wherein each of the CA contact liner portions, the CB contact liner portions, the first interconnect liner portions and the second interconnect liner portions comprises Ti, Ta, Ni, Co, Pt, W, TiN, TaN, WN, WC, an alloy thereof or stack thereof.

3. The semiconductor structure of claim 1, wherein each of the CA contact conductor portion, the CB contact conductor portion, the first interconnect conductor portion and the second interconnect conductor portion comprises Cu, W, Al, Co, Ru, Mo, Os, Ir, Rh or an alloy thereof.

4. The semiconductor structure of claim 1, wherein the CA contact structure is located within a CA contact opening extending through a first contact level dielectric layer that is located over the ILD layer, and the CB contact structure is located within a CB contact opening extending through the first contact level dielectric layer and a gate cap of the gate structure, wherein the CA contact liner portions are present in their entirety on sidewalls of the CA contact opening, and the CB contact liner portions are present in their entirety on sidewalls of the CB contact opening.

5. The semiconductor structure of claim 4, further comprising a dielectric cap layer located between the ILD layer and the first contact level dielectric layer, wherein each of the CA contact opening and the CB contact opening extends through the dielectric cap layer.

6. The semiconductor structure of claim 1, wherein the first interconnect structure is located within a first interconnect opening extending through a second contact level dielectric layer that is located over the first contact level dielectric layer, and the second interconnect structure is located within a second interconnect opening extending through the second contact level dielectric layer, wherein the first interconnect liner portions are present in their entirety on sidewalls of the first interconnect opening, and the second interconnect liner portions are present in their entirety on sidewalls of the second interconnect opening.

7. The semiconductor structure of claim 6, further comprising a dielectric cap layer located between the first contact level dielectric layer and the second contact level dielectric layer, wherein each of the first interconnect opening and the second interconnect opening extends through the dielectric cap layer.

8. The semiconductor structure of claim 1, further comprising a metal semiconductor alloy region located over each of the source/drain regions, wherein the trench contact structure is in direct contact with the metal semiconductor alloy region.

9. The semiconductor structure of claim 1, wherein the trench contact structure is located within a trench contact opening extending through the ILD layer and comprises a trench contact liner portion located on sidewalls and bottom surface of the trench contact opening and a trench contact conductor portion filling a remaining volume of the trench contact opening, wherein a horizontal portion of the trench contact liner portion contacts the one of the source/drain regions.

10. A semiconductor structure comprising:
a gate structure located over a channel region of a semiconductor fin and laterally surrounded by an inter-level dielectric (ILD) layer;
source/drain regions located on opposite sides of the gate structure;
a trench contact structure embedded within the ILD layer and contacting each of the source/drain regions;
a multi-level source/drain contact structure overlying the trench contact structure and comprising a stack of a CA contact structure and a first interconnect contact structure overlying the CA contact structure, wherein the CA contact structure comprises a CA contact conductor portion in direct contact with a trench contact conductor portion in the trench contact structure and CA contact liner portions laterally surrounding the CA contact conductor portion, and the first interconnect contact structure comprises a first interconnect conductor portion in direct contact with the CA contact conductor portion and first interconnect liner portions laterally surrounding the first interconnect conductor portion; and
a multi-level gate contact structure overlying the gate structure and comprising a stack of a CB contact structure and a second interconnect contact structure overlying the CB contact structure, wherein the CB contact structure comprises a CB contact conductor portion in direct contact with a gate electrode in the gate structure and CB contact liner portions laterally surrounding the CB contact conductor portion, and the second interconnect contact structure comprises a second interconnect conductor portion in direct contacting the CB contact conductor portion and second interconnect liner portions laterally surrounding the second interconnect conductor portion, wherein the CA contact structure is located within a CA contact opening extending through a first contact level dielectric layer that is located over the ILD layer, and the CB contact structure is located within a CB contact opening extending through the first contact level dielectric layer and a gate cap of the gate structure, wherein the CA contact liner portions are present in their entirety on sidewalls of the CA contact opening, and the CB contact liner portions are present in their entirety on sidewalls of the CB contact opening, and further wherein a dielectric cap layer is located between the ILD layer and the first contact level dielectric layer, wherein each of the CA contact opening and the CB contact opening extends through the dielectric cap layer.

11. A semiconductor structure comprising:
a gate structure located over a channel region of a semiconductor fin and laterally surrounded by an inter-level dielectric (ILD) layer;
source/drain regions located on opposite sides of the gate structure;
a trench contact structure embedded within the ILD layer and contacting each of the source/drain regions;
a multi-level source/drain contact structure overlying the trench contact structure and comprising a stack of a CA contact structure and a first interconnect contact structure overlying the CA contact structure, wherein the CA contact structure comprises a CA contact conductor portion in direct contact with a trench contact conductor portion in the trench contact structure and CA contact liner portions laterally surrounding the CA contact conductor portion, and the first interconnect contact structure comprises a first interconnect conductor portion in direct contact with the CA contact conductor portion and first interconnect liner portions laterally surrounding the first interconnect conductor portion; and a multi-level gate contact structure overlying the gate structure and comprising a stack of a CB contact structure and a second interconnect contact structure overlying the CB contact structure, wherein the CB contact structure comprises a CB contact conductor portion in direct contact with a gate electrode in the gate structure and CB contact liner portions laterally surrounding the CB contact conductor portion, and the second interconnect contact structure comprises a second interconnect conductor portion in direct contacting the CB contact conductor portion and second interconnect liner portions laterally surrounding the second interconnect conductor portion, wherein the first interconnect structure is located within a first interconnect opening extending through a second contact level dielectric layer that is located over the first contact level dielectric layer, and the second interconnect structure is located within a second interconnect opening extending through the second contact level dielectric layer, wherein the first interconnect liner portions are present in their entirety on sidewalls of the first interconnect opening, and the second interconnect liner portions are present in their entirety on sidewalls of the second interconnect opening, and wherein a dielectric cap layer is located between the first contact level dielectric layer and the second contact level dielectric layer, wherein each of the first interconnect opening and the second interconnect opening extends through the second dielectric cap layer.

\* \* \* \* \*